United States Patent
Liao et al.

(10) Patent No.: US 10,613,444 B2
(45) Date of Patent: Apr. 7, 2020

(54) SEMICONDUCTOR APPARATUS AND METHOD OF OPERATING THE SAME

(71) Applicant: TAIWAN SEMICONDUCTOR MANUFACTURING CO., LTD., Hsinchu (TW)

(72) Inventors: Chi-Hung Liao, New Taipei (TW); Min-Cheng Wu, Taitung County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/115,476

(22) Filed: Aug. 28, 2018

(65) Prior Publication Data

US 2020/0073248 A1    Mar. 5, 2020

(51) Int. Cl.
| | | |
|---|---|---|
| *G03F 1/24* | (2012.01) | |
| *G03F 7/20* | (2006.01) | |
| *G21K 1/06* | (2006.01) | |
| *H05K 7/20* | (2006.01) | |

(52) U.S. Cl.
CPC ............ *G03F 7/702* (2013.01); *G21K 1/062* (2013.01); *H05K 7/2029* (2013.01); *G21K 2201/061* (2013.01); *G21K 2201/065* (2013.01)

(58) Field of Classification Search
CPC ............ G03F 7/70891; G03F 7/70916; G03F 7/70166; G03F 7/70266; G03F 1/24; G03F 7/7015; G03F 7/708; G02B 7/1815; G02B 7/181; G02B 5/0891; G02B 17/0892

USPC .......... 250/504 R, 365, 431, 492.2; 359/845, 359/626
See application file for complete search history.

(56) References Cited

U.S. PATENT DOCUMENTS

| | | | | |
|---|---|---|---|---|
| 7,196,342 B2 * | 3/2007 | Ershov | ................... | B82Y 10/00 250/504 R |
| 8,057,053 B2 * | 11/2011 | Hauf | ..................... | G02B 7/1815 359/845 |
| 8,530,870 B2 * | 9/2013 | Kakizaki | ............. | G03F 7/70033 134/1.1 |
| 8,764,995 B2 | 7/2014 | Chang et al. | | |
| 8,796,666 B1 | 8/2014 | Huang et al. | | |
| 8,810,775 B2 * | 8/2014 | Kools | .................. | G02B 5/0891 355/67 |
| 8,828,625 B2 | 9/2014 | Lu et al. | | |
| 8,841,047 B2 | 9/2014 | Yu et al. | | |
| 8,848,290 B2 * | 9/2014 | Hull | ..................... | G02B 7/1815 359/399 |
| 8,877,409 B2 | 11/2014 | Hsu et al. | | |
| 9,029,815 B2 * | 5/2015 | Sato | .................... | G03F 7/70166 250/504 R |
| 9,093,530 B2 | 7/2015 | Huang et al. | | |
| 9,146,477 B2 * | 9/2015 | Jansen | ................ | G03F 7/70308 |
| 9,184,054 B1 | 11/2015 | Huang et al. | | |
| 9,207,541 B2 * | 12/2015 | Hauf | ..................... | G02B 7/181 |
| 9,256,123 B2 | 2/2016 | Shih et al. | | |
| 9,316,929 B2 * | 4/2016 | Baer | ..................... | B82Y 10/00 |
| 9,436,101 B2 * | 9/2016 | Schoeppach | ........ | G03F 7/70825 |

(Continued)

*Primary Examiner* — David A Vanore
(74) *Attorney, Agent, or Firm* — Maschoff Brennan

(57) ABSTRACT

A semiconductor apparatus includes a light source, a reflection mirror, and a heat exchanger. The reflection mirror has a reflection surface configured to reflect a light of the light source and a channel behind the reflection surface. The heat exchanger is connected to the channel and configured to circulate a working fluid in the channel.

20 Claims, 11 Drawing Sheets

(56) References Cited

U.S. PATENT DOCUMENTS

| | | | |
|---|---|---|---|
| 9,465,307 B2 * | 10/2016 | Mizoguchi | G03F 7/70925 |
| 9,500,957 B2 * | 11/2016 | Hartjes | G02B 7/1815 |
| 9,529,268 B2 | 12/2016 | Chang et al. | |
| 9,548,303 B2 | 1/2017 | Lee et al. | |
| 9,599,812 B2 * | 3/2017 | Metzmacher | H05H 1/44 |
| 10,216,101 B2 * | 2/2019 | Nienhuys | G03F 7/70266 |
| 2002/0171817 A1 * | 11/2002 | Babonneau | B82Y 10/00 |
| | | | 355/67 |
| 2004/0262541 A1 * | 12/2004 | Honda | F25B 21/02 |
| | | | 250/492.2 |
| 2007/0248127 A1 * | 10/2007 | Shiraishi | G02B 7/008 |
| | | | 372/36 |
| 2009/0122428 A1 * | 5/2009 | Phillips | G02B 7/008 |
| | | | 359/846 |
| 2009/0122429 A1 * | 5/2009 | Watson | G02B 7/008 |
| | | | 359/846 |
| 2009/0153975 A1 * | 6/2009 | O'Reilly | G03F 7/70033 |
| | | | 359/626 |
| 2010/0263192 A1 * | 10/2010 | Phillips | G02B 7/181 |
| | | | 29/468 |
| 2010/0321649 A1 * | 12/2010 | Baer | G02B 5/0891 |
| | | | 355/30 |
| 2012/0281189 A1 * | 11/2012 | Grek | G03F 7/70166 |
| | | | 355/30 |
| 2014/0071523 A1 * | 3/2014 | Hartjes | G02B 7/1815 |
| | | | 359/359 |
| 2014/0247512 A1 * | 9/2014 | Scheiding | B22F 3/1055 |
| | | | 359/871 |
| 2014/0327896 A1 * | 11/2014 | Waldis | G02B 26/0833 |
| | | | 355/67 |
| 2015/0219874 A1 * | 8/2015 | Figueredo | G03F 7/70891 |
| | | | 359/845 |

* cited by examiner

SEMICONDUCTOR APPARATUS AND METHOD OF OPERATING THE SAME

BACKGROUND

In the manufacture of integrated circuits (IC), patterns representing different layers of the IC are fabricated using a series of reusable photomasks ("masks") to transfer the design of each layer of the IC onto a semiconductor substrate during the manufacturing process in a photolithography process. These layers are built up using a sequence of processes and resulted in transistors and electrical circuits. However, as the IC sizes continue to shrink, meeting accuracy requirements as well as reliability in multiple layer fabrication has become increasingly more difficult. Photolithography uses an imaging system that directs radiation onto the photomask and then projects a shrunken image of the photomask onto a semiconductor wafer covered with photoresist. The radiation used in the photolithography may be at any suitable wavelength, with the resolution of the system increasing with decreasing wavelength. With the shrinkage in IC size, extreme ultraviolet (EUV) lithography with a typical wavelength of 13.5 nm becomes one of the leading technologies for 16 nm and smaller node device patterning.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
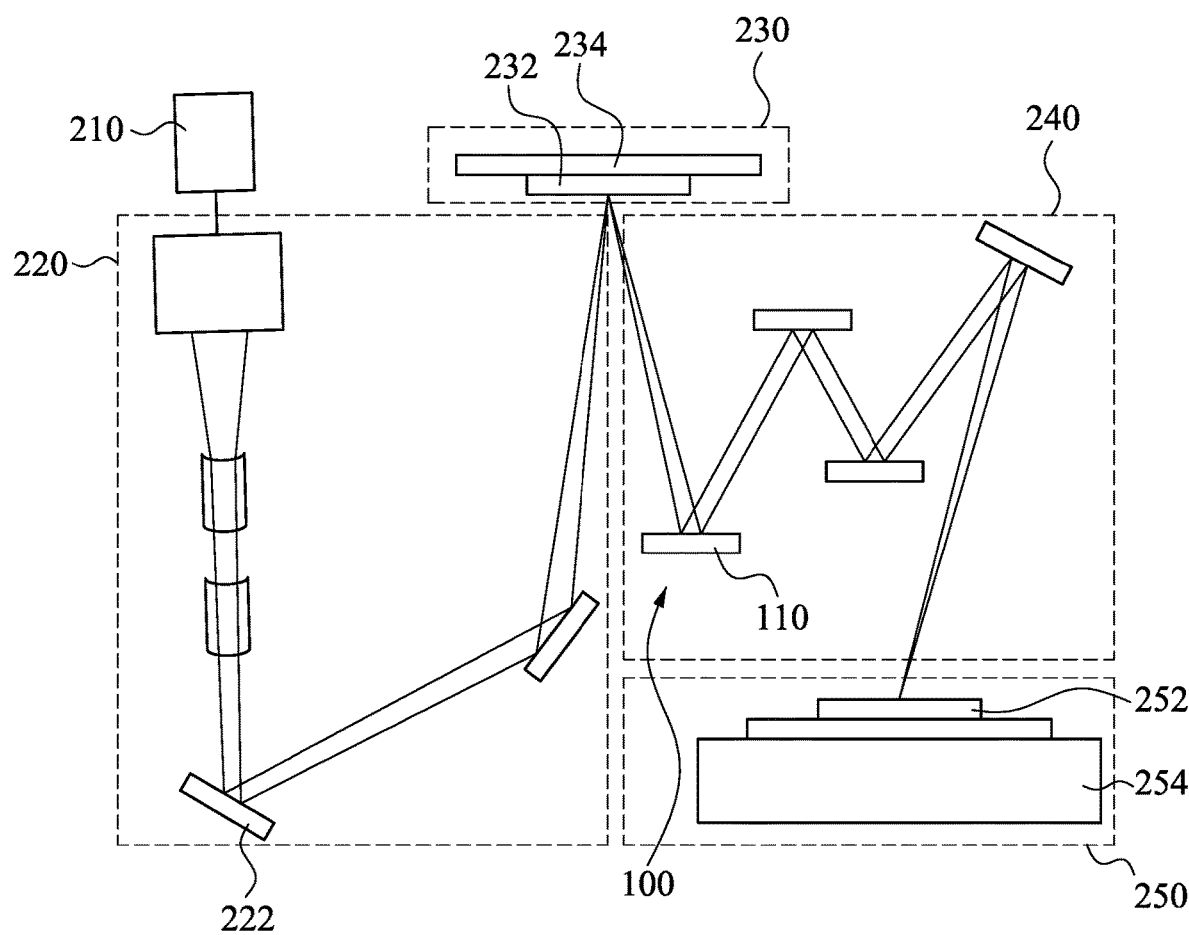
FIG. 1 is a side view of a photolithography imaging system including a reflection mirror assembly in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a side view of a photolithography imaging system 200 including a reflection mirror assembly 100 in accordance with some embodiments of the present disclosure. Referring to FIG. 1, the photolithography imaging system 200 is a semiconductor apparatus, such as an extreme ultraviolet (EUV) lithography imaging system including a light source 210, a condenser optics section 220, a mask stage 230, a projection optics section 240, and a wafer stage 250. The light source 210 may be any source able to produce radiation in the EUV wavelength range. One example of a suitable light source 210 is creates a plasma when a laser illuminates a gas, such as a supersonic jet of xenon gas. As another example, a suitable light source 210 may be used bending magnets and undulators associated with synchrotrons. As a further example, a suitable light source 210 may be use discharge sources, which have the potential to provide adequate power in the desired wavelength range. EUV radiation is strongly absorbed in virtually all transmissive materials, including gases and glasses. To minimize unwanted absorption, EUV imaging is carried out in near vacuum. The condenser optics section 220 brings the radiation from the light source 210 to the mask stage 240. In the EUV lithography imaging system 200, the condenser optics is reflective because EUV radiation is strongly absorbed in traditionally transmissive materials such as lenses, which may be used in traditional photolithography imaging systems. Accordingly, the condenser optics section 220 includes condenser reflectors or mirrors 222 that collect and focus the radiation from the light source 210 onto the mask stage 230. Any number of condenser mirrors 222 may be used, such as, for example, the four shown in FIG. 1.

The mask stage 230 includes a transport stage 234 that scans a mask 232. In the EUV lithography imaging system 200, the mask 232 is reflective because EUV radiation is strongly absorbed in most materials such as transmissive photomasks that are used in traditional photolithography imaging systems. The projection optics section 240 reduces the image from the mask 232 in the mask stage 230 and forms the image onto a wafer 252 in the wafer stage 250. In the EUV lithography imaging system 200, the projection optics is reflective because of the absorption associated with EUV radiation. Accordingly, the projection optics section 240 includes reflection mirrors 110 of reflection mirror assemblies 100 that project radiation reflected from the mask stage 230 onto the wafer 252. The reflectance spectrum of the mask 232 may be matched to that of the reflection mirrors 110 in the projection optics section 240. The term "projection optics" used herein should be broadly interpreted as encompassing any type of projection system, including refractive, reflective, catadioptric, magnetic, electromagnetic and electrostatic optical systems, or any combination thereof, as appropriate for the exposure radiation being used.

The projection optics section 240, which may be a projection optics box (POB), reduces the image from the mask 232 in the mask stage 230 and forms the image onto the wafer 252 in the wafer stage 250. In the EUV lithography imaging system 200, the projection optics is reflective because of the absorption associated with EUV radiation. Accordingly, the projection optics section 240 includes the reflection mirrors 110 that project radiation reflected from the mask 232 onto the wafer 252. The reflectance spectrum of the mask 232 may be matched to that of the reflection mirrors 110 in the projection optics section 240. The term "projection optics" used herein should be broadly interpreted as encompassing any type of projection system, including refractive, reflective, catadioptric, magnetic, electromagnetic and electrostatic optical systems, or any combination thereof, as appropriate for the exposure radiation being used. The reflection mirrors 110 are disposed in a vacuum environment of the projection optics section 240.

The wafer stage 250 includes a transport stage 254 that scans the semiconductor wafer 252 in synchrony with the mask 232 and steps the wafer 252 into a position to accept a next image from the mask 232. During operation, the semiconductor wafer 252 mounted to the transport stage 254. The projection optics conveys the radiation light with a pattern in its cross-section to create a pattern in a target portion of the wafer 252. It should be noted that the pattern conveyed to the radiation light may not exactly correspond to the desired pattern in the target portion of the wafer 252, for example if the pattern includes phase-shifting features or shadows. Generally, the pattern conveyed to the radiation light will correspond to a particular functional layer in a device being created in a target portion of the wafer 252, such as an IC.

In the following description, detailed structures of the reflection mirror assembly 100 having the reflection mirror 110 will be described.

Figure 2:
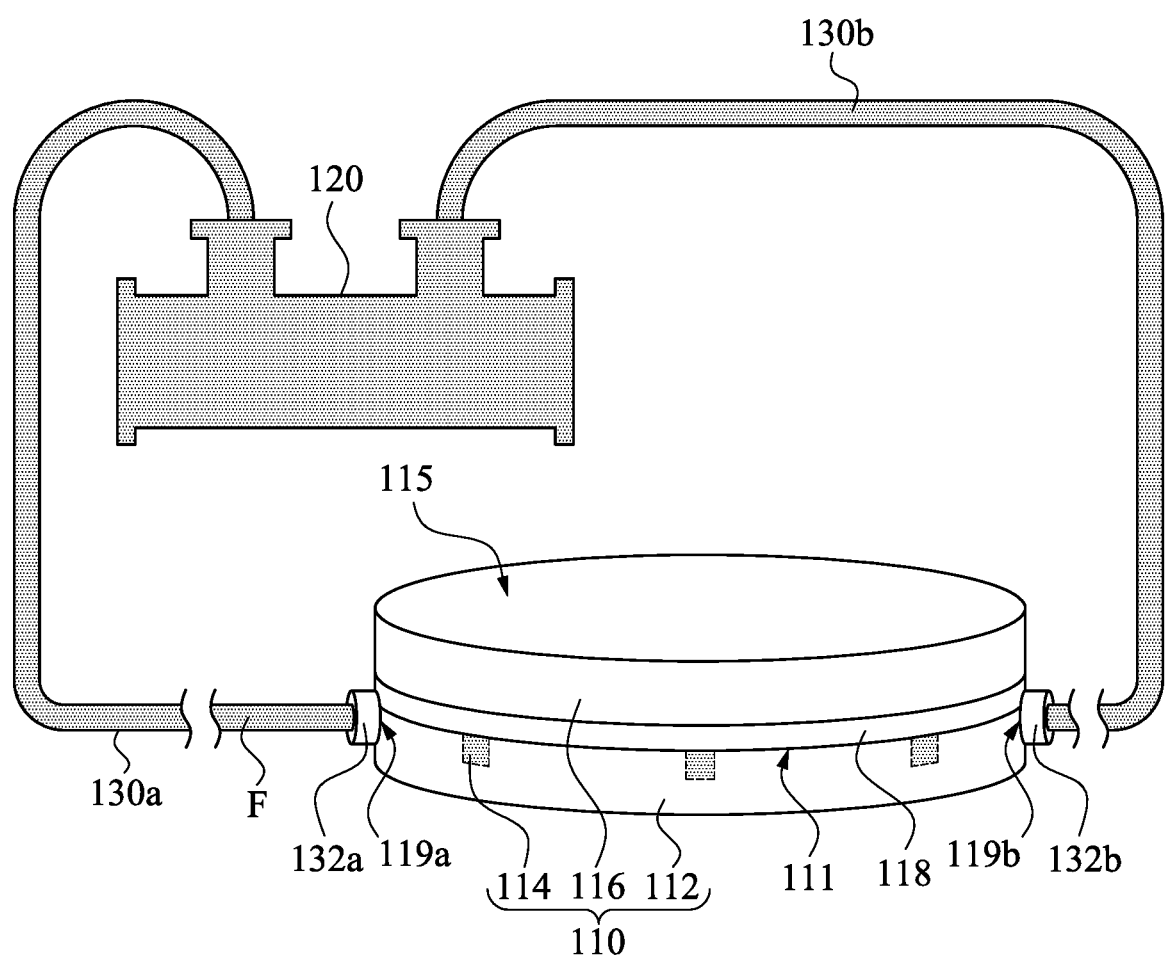
FIG. 2 is a perspective view of the reflection mirror assembly shown in FIG. 1.

FIG. 2 is a perspective view of the reflection mirror assembly 100 shown in FIG. 1. The reflection mirror assembly 100 includes the reflection mirror 110 and a heat exchanger 120. The reflection mirror 110 has a reflection surface 115 configured to reflect a light (e.g., EUV radiation) of the light source 210 (see FIG. 1) and a channel 114 behind the reflection surface 115. The heat exchanger 120 is connected to the channel 114, and is configured to circulate a working fluid F in the channel 114. Moreover, the reflection mirror 110 includes a first portion 112 (e.g., a lower portion) and a second portion 116 (e.g., an upper portion). The upper portion 116 is on the lower portion 112 and has the reflection surface 115 that faces away from the lower portion 112. In some embodiments, the upper portion 116 is adhered to the lower portion 112 through an adhesive layer 118. The adhesive layer 118 is in the reflection mirror 110, and is between a top surface 111 of the lower portion 112 and a bottom surface 117 of the upper portion 116. The heat exchanger 120 is connected to the channel 114 through pipes 130a and 130b and connectors 132a and 132b. In some embodiments, the reflection mirror 110 is made of a material including galvanized iron, but the present disclosure is not limited in this regard.

Figure 3:
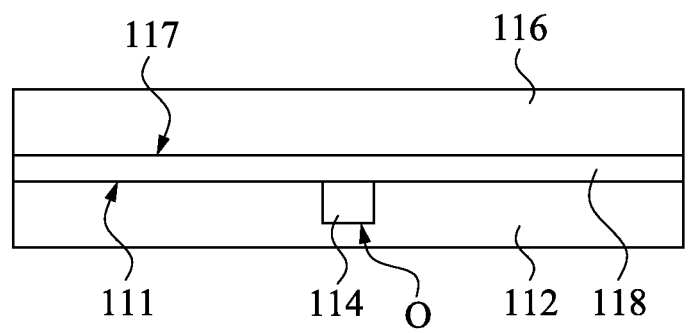
FIG. 3 is a side view of a reflection mirror of FIG. 2 when a pipe and a connector are removed.

FIG. 3 is a side view of the reflection mirror 110 of FIG. 2 when the pipe 130a or 130b and the connector 132a or 132b are removed. In some embodiments, the channel 114 is a trench in the top surface 111 of the lower portion 112 of the reflection mirror 110. In other words, the channel 114 is defined by the top surface 111 of the lower portion 112. An end of the channel 114 can form an opening O in a sidewall of the lower portion 112 of the reflection mirror 110. As a result, the opening O of the channel 114 can be used as each of a fluid inlet 119a and a fluid outlet 119b of the reflection mirror 110 (see FIG. 2).

Figure 4:
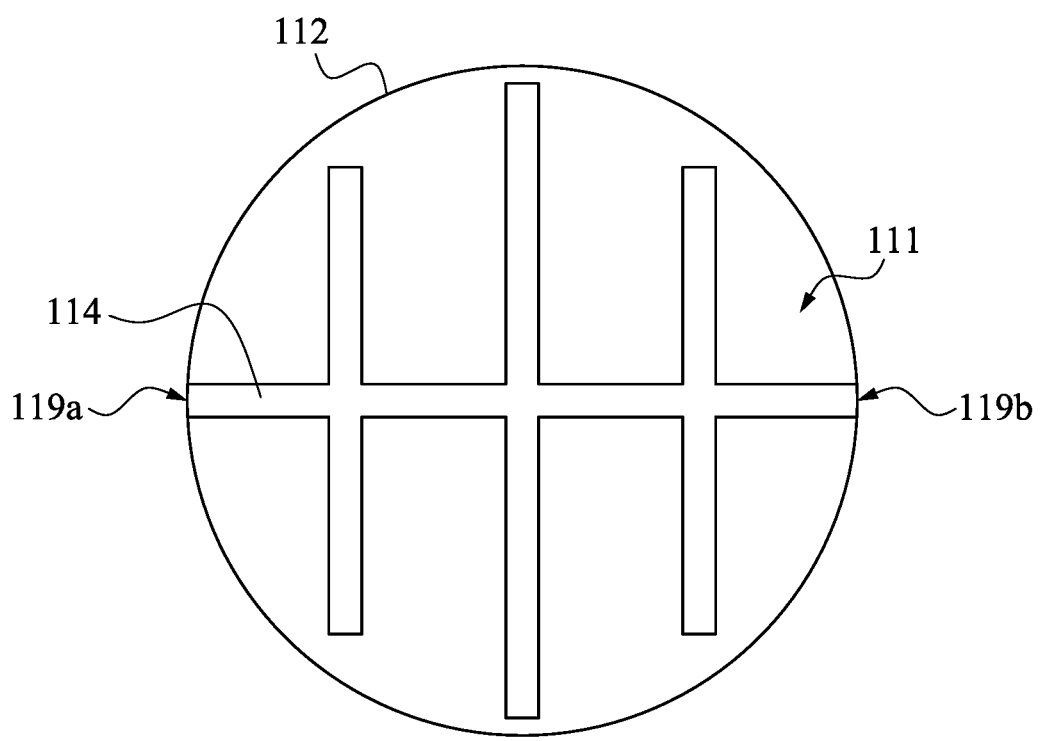
FIG. 4 is a top view of a lower portion of the reflection mirror of FIG. 3 when an upper portion of the reflection mirror is removed.

FIG. 4 is a top view of the lower portion 112 of the reflection mirror 110 of FIG. 3 when the upper portion 116 of the reflection mirror 110 is removed. As shown in FIG. 2 and FIG. 4, the reflection mirror 110 has the fluid inlet 119a and the fluid outlet 119b that are respectively at two ends of the channel 114. Each of the fluid inlet 119a and the fluid outlet 119b may be shown by the opening O FIG. 3. One end of the pipe 130a and one end of the pipe 130b respectively have the connector 132a and the connector 132b. The connector 132a and the connector 132b may be coupled to the fluid inlet 119a and the fluid outlet 119b, respectively. In some embodiments, the reflection mirror assembly 100 further includes a working fluid F in the channel 114. Moreover, the heat exchanger 120 and the pipes 130a and 130b may also have the working fluid F therein. In some embodiments, the heat exchanger 120 is a heat exchanger configured to circulate the working fluid F. The heat exchanger 120 can provide a cooling working fluid F to enter the reflection mirror 110 through the fluid inlet 119a. After the working fluid F having a low temperature flows along the channel 114 to pass through the reflection mirror 110, the temperature of the working fluid F is increased because the energy of the EUV radiation irradiates the reflection mirror 110. The heat exchanger 120 can receive the heated working fluid F from the fluid outlet 119b of the reflection mirror 110 and can cool the working fluid F. In some embodiments, the working fluid F may be electrolytic water to prevent the reflection mirror 110 from oxidation.

Referring to FIG. 1, when the photolithography imaging system 200 is in operation, the reflection mirror 110 of the reflection mirror assembly 100 receives EUV radiation from the mask stage 230 and reflects the EUV radiation onto another reflection mirror 110 or onto the wafer 252. Because the EUV radiation has high energy to affect temperature uniformity of a traditional reflection mirror, the traditional reflection mirror may collect high temperature to cause deformation. The deformation may lead the traditional reflection mirror to scatter the EUV radiation, thereby reducing intensity and forming aberration. However, since the reflection mirror 110 of the reflection mirror assembly 100 has the channel 114 therein, the working fluid F can pass through the reflection mirror 110 by the channel 114 to reduce the temperature of the reflection mirror 110 even if the reflection mirror 110 is in the vacuum environment of the projection optics section 240. The temperature of the working fluid F is controlled by the heat exchanger 120, such that the working fluid F can dissipate the heat of the reflection mirror 110 to shrink the reflection mirror 110. The working fluid F and the channel 114 may reduce the temperature of heated regions of the reflection mirror 110 receiving the EUV radiation, thereby decreasing temperature difference. As a result, the temperature of the reflection mirror 110 maintains uniform to prevent from deformation and aberration, thereby increasing production capacity and product yield. In addition, the lifetime of the reflection mirror 110 can be extended and the performance of the EUV radiation can be improved.

In some embodiments, the channel 114 of the reflection mirror 110 may have a straight profile, a curved profile, a cross-shaped profile, a concentric circular profile, or combinations thereof. As shown in FIG. 4, the channel 114 includes four straight portions, in which one straight portion is in a transverse direction and three straight portions are in a longitudinal direction. In other words, the channel 114 has three cross-shaped portions. When the reflection mirror 110 is fixed in a position of the projection optics section 240 without change, the reflection mirror 110 having the pattern of the channel 114 of FIG. 4 may facilitate the temperature uniformity of the reflection mirror 110.

In some embodiments, the formation of the reflection mirror 110 includes cutting a reflection mirror to form the lower portion 112 and the upper portion 116, forming the channel 114 in at least one of the lower portion 112 and the upper portion 116, and adhering the upper portion 116 to the lower portion 112 through the adhesive layer 118.

Figure 5:
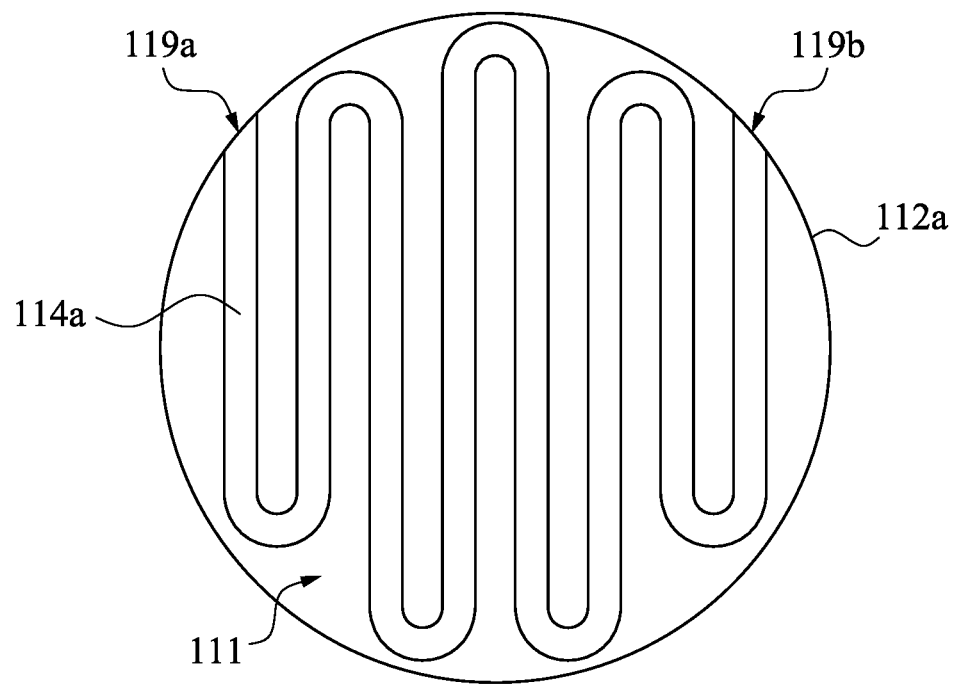
FIG. 5 is a top view of a lower portion of a reflection mirror in accordance with some embodiments of the present disclosure.

FIG. 5 is a top view of a lower portion 112a of a reflection mirror in accordance with some embodiments of the present disclosure. As shown in FIG. 5, a channel 114a is a trench in the lower portion 112a, in which portions of the channel 114a have a straight profile, and other portions of the channel 114a have a curved profile. In some embodiments, two ends of each curved portion of the channel 114a respectively adjoin two adjacent straight portions of the channel 114a. The lower portion 112a of FIG. 5 may be used in the reflection mirror 110 of FIGS. 1 and 2 to replace the lower portion 112.

Figure 6:
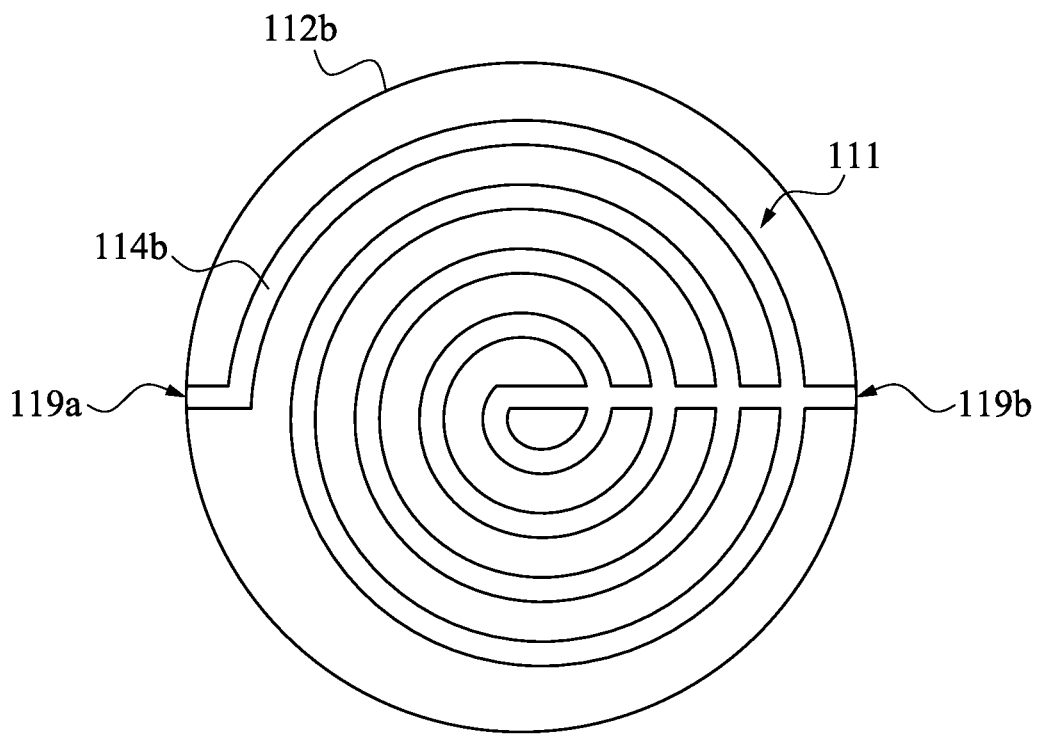
FIG. 6 is a top view of a lower portion of a reflection mirror in accordance with some embodiments of the present disclosure.

FIG. 6 is a top view of a lower portion 112b of a reflection mirror in accordance with some embodiments of the present disclosure. As shown in FIG. 6, a channel 114b is a trench in the lower portion 112b, in which portions of the channel 114b have a concentric circular profile, and the other two portions of the channel 114b have a straight profile. In some embodiments, two ends of one of the straight portions of the channel 114a respectively adjoin the fluid inlet 119a and the peripheral region of the concentric circular portions of the channel 114a, and two ends of the other straight portion of the channel 114a respectively adjoin the fluid outlet 119b and the central region of the concentric circular portions of the channel 114a. In addition, the straight portion of the channel 114a adjoining the fluid outlet 119b crosses the concentric circular portions of the channel 114a. If the light source 210 of FIG. 1 can be rotated, a reflection mirror having the lower portion 112b with the channel 114b of FIG. 6 used in the projection optics section 240a of FIG. 1 may facilitate the temperature uniformity of the reflection mirror. In some embodiments, the lower portion 112b of FIG. 6 may be used in the reflection mirror 110 of FIGS. 1 and 2 to replace the lower portion 112.

Figure 7:
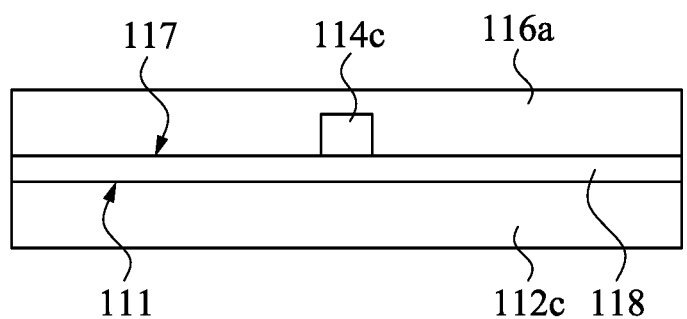
FIG. 7 is a side view of a reflection mirror in accordance with some embodiments of the present disclosure.

FIG. 7 is a side view of a reflection mirror 110a in accordance with some embodiments of the present disclosure. As shown in FIG. 7, the reflection mirror 110a includes a lower portion 112c, a channel 114c, and an upper portion 116a. The channel 114c is a trench. In some embodiments, the channel 114c of the reflection mirror 110a shown in FIG. 7 is in the bottom surface 117 of the upper portion 116a of the reflection mirror 110a. In other words, the channel 114c is defined by the bottom surface 117 of the upper portion 116a. Moreover, the lower portion 112c of the reflection mirror 110a has no trench therein. The channel 114c of the reflection mirror 110a may have a straight profile, a curved profile, a cross-shaped profile, a concentric circular profile, or combinations thereof. In some embodiments, a bottom view of the upper portion 116a may be substantially the same as the top view of the lower portion 112 of FIG. 4. In alternative embodiments, a bottom view of the upper portion 116a may be substantially the same as the top view of the lower portion 112a of FIG. 5. In various embodiments, a bottom view of the upper portion 116a may be substantially the same as the top view of the lower portion 112b of FIG. 6. In other words, the channel 114c of the reflection mirror 110a may have a pattern like the channel 114 of FIG. 4, the channel 114a of FIG. 5, or the channel 114b of FIG. 6.

Figure 8:
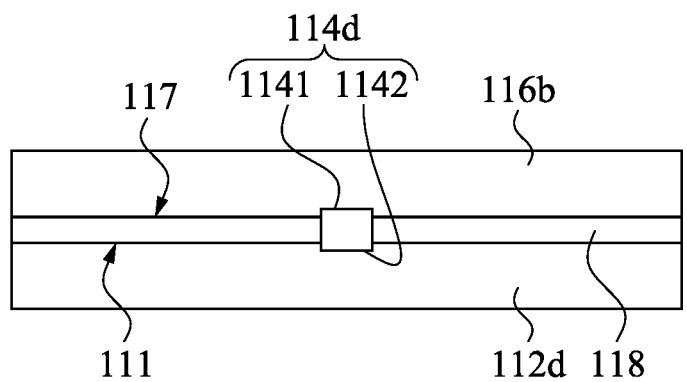
FIG. 8 is a side view of a reflection mirror in accordance with some embodiments of the present disclosure.

FIG. 8 is a side view of a reflection mirror 110b in accordance with some embodiments of the present disclosure. The reflection mirror 110b includes a lower portion 112d, a channel 114d, and an upper portion 116b. The channel 114d is defined by a top surface 111 of the lower portion 112d and a bottom surface 117 of the upper portion 116b. The channel 114d is a trench and has a bottom portion 1141 and a top portion 1142 that are respectively in the top surface 111 of the lower portion 112d and the bottom surface 117 of the upper portion 116b. Furthermore, the top portion of the channel 114d corresponds to the bottom portion of the channel 114d in position. In other words, the top portion 1142 of the channel 114d is substantially aligned with the bottom portion 1141 of the channel 114d. Therefore, a top view of the lower portion 112d having the bottom portion 1141 of the channel 114d has the same trench pattern as a bottom view of the upper portion 116b having the top portion 1142 of the channel 114d.

In some embodiments, the top view of the lower portion 112d and the bottom view of the upper portion 116b may be substantially the same as the top view of the lower portion 112 of FIG. 4. In alternative embodiments, the top view of the lower portion 112d and the bottom view of the upper portion 116b may be substantially the same as the top view of the lower portion 112a of FIG. 5. In various embodiments, the top view of the lower portion 112d and the bottom view of the upper portion 116b may be substantially the same as the top view of the lower portion 112b of FIG. 6. As a result of such a configuration, the channel 114d formed in the lower portion 112d and the upper portion 116b of the reflection mirror 110*b* may have a pattern like the channel 114 of FIG. 4, the channel 114*a* of FIG. 5, or the channel 114*b* of FIG. 6.

Figure 9:
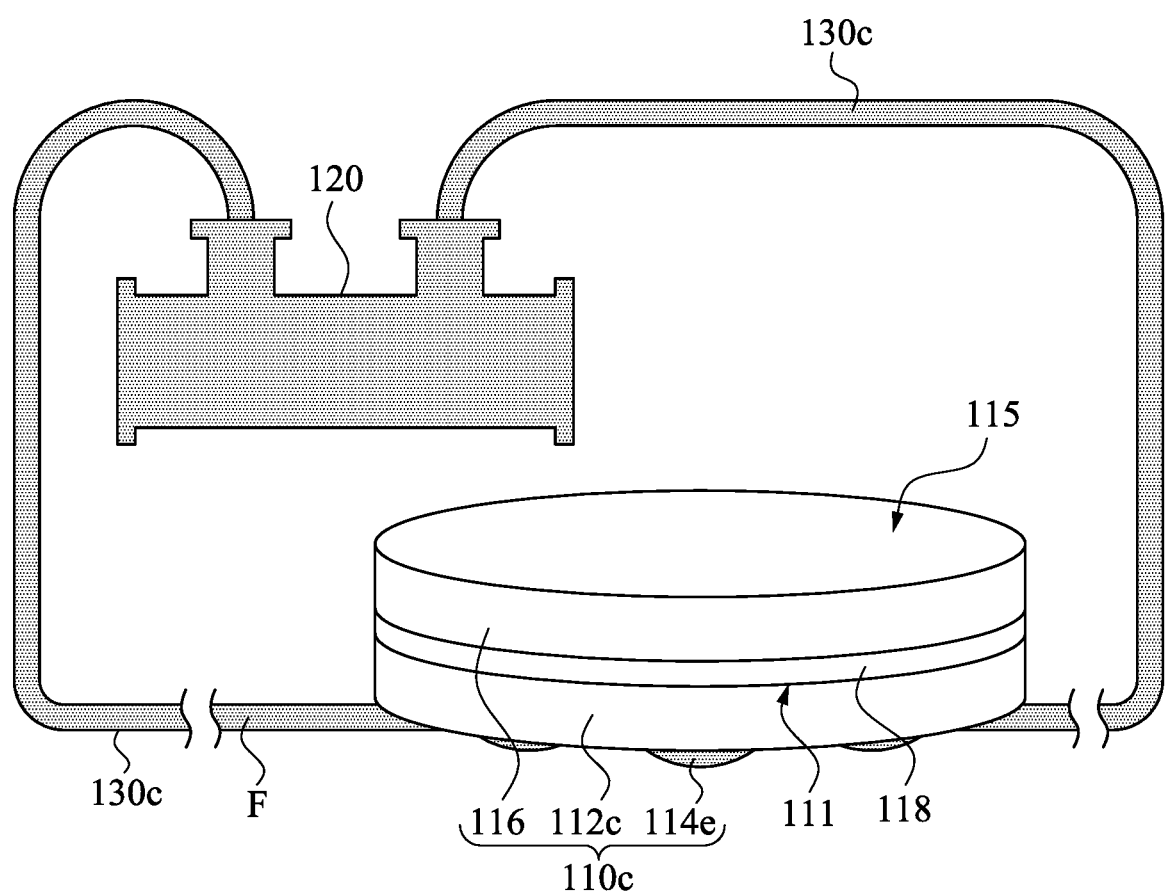
FIG. 9 is a perspective view of a reflection mirror assembly in accordance with some embodiments of the present disclosure.

FIG. 9 is a perspective view of a reflection mirror assembly 100*a* in accordance with some embodiments of the present disclosure. The reflection mirror assembly 100*a* includes a reflection mirror 110*c* and the heat exchanger 120. The reflection mirror 110*c* includes a lower portion 112*c*, a channel 114*e*, and the upper portion 116. The channel 114*e* is below the reflection surface 115 of the reflection mirror 110*c*. In some embodiments, the channel 114*e* show in FIG. 9 is a portion of a pipe 130*c* on a bottom surface 113 of the lower portion 112*c*. In other words, the pipe 130*c* below the lower portion 112*c* defines the channel 114*e* on the bottom surface 113 of the reflection mirror 110*c*. The heat exchanger 120 is connected to the channel 114*e* (i.e., the pipe 130*c*).

Figure 10:
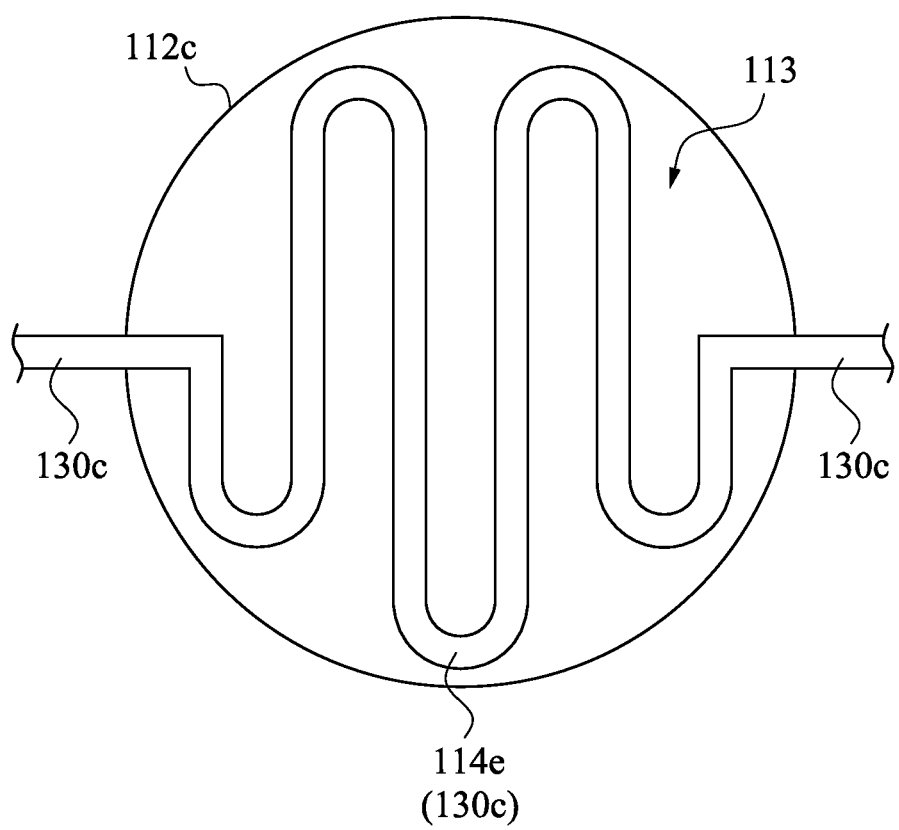
FIG. 10 is a bottom view of a lower portion of the reflection mirror shown in FIG. 9.

FIG. 10 is a bottom view of the lower portion 112*c* of the reflection mirror 110*c* shown in FIG. 9. As shown in FIG. 9 and FIG. 10, the reflection mirror assembly 100*a* further includes the working fluid F in the pipe 130*c* (i.e., the channel 130*c*). Moreover, the heat exchanger 120 and the pipe 130*c* may also have the working fluid F therein. In some embodiments, the heat exchanger 120 is a heat exchanger configured to circulate the working fluid F. The heat exchanger 120 can provide a cooling working fluid F to pass the bottom surface 113 of the reflection mirror 110*c* through the pipe 130*c*. After the working fluid F having a low temperature flows along the pipe 130*c*, the temperature of the working fluid F is increased because the energy of the EUV radiation irradiates the reflection mirror 110. The heat exchanger 120 can receive the heated working fluid F from one side of the pipe 130*c* and can cool the working fluid F. In some embodiments, the pipe 130*c* of the reflection mirror 110*c* may have a straight profile, a curved profile, a cross-shaped profile, a concentric circular profile, or combinations thereof.

When the photolithography imaging system 200 of FIG. 1 is in operation, because the reflection mirror 110*c* of the reflection mirror assembly 100*a* has the pipe 130*c* thereon, the working fluid F can pass through the reflection mirror 110*a* by the pipe 130*c* to reduce the temperature of the reflection mirror 110*c* even if the reflection mirror 110*c* is in the vacuum environment of the projection optics section 240. The working fluid F and the pipe 130*c* may reduce the temperature of heated regions of the reflection mirror 110*c* receiving the EUV radiation. As a result, the temperature of the reflection mirror 110*c* maintains uniform to prevent from deformation and aberration, thereby increasing production capacity and product yield. In addition, the lifetime of the reflection mirror 110*c* can be extended and the performance of the EUV radiation can be improved.

Figure 11:
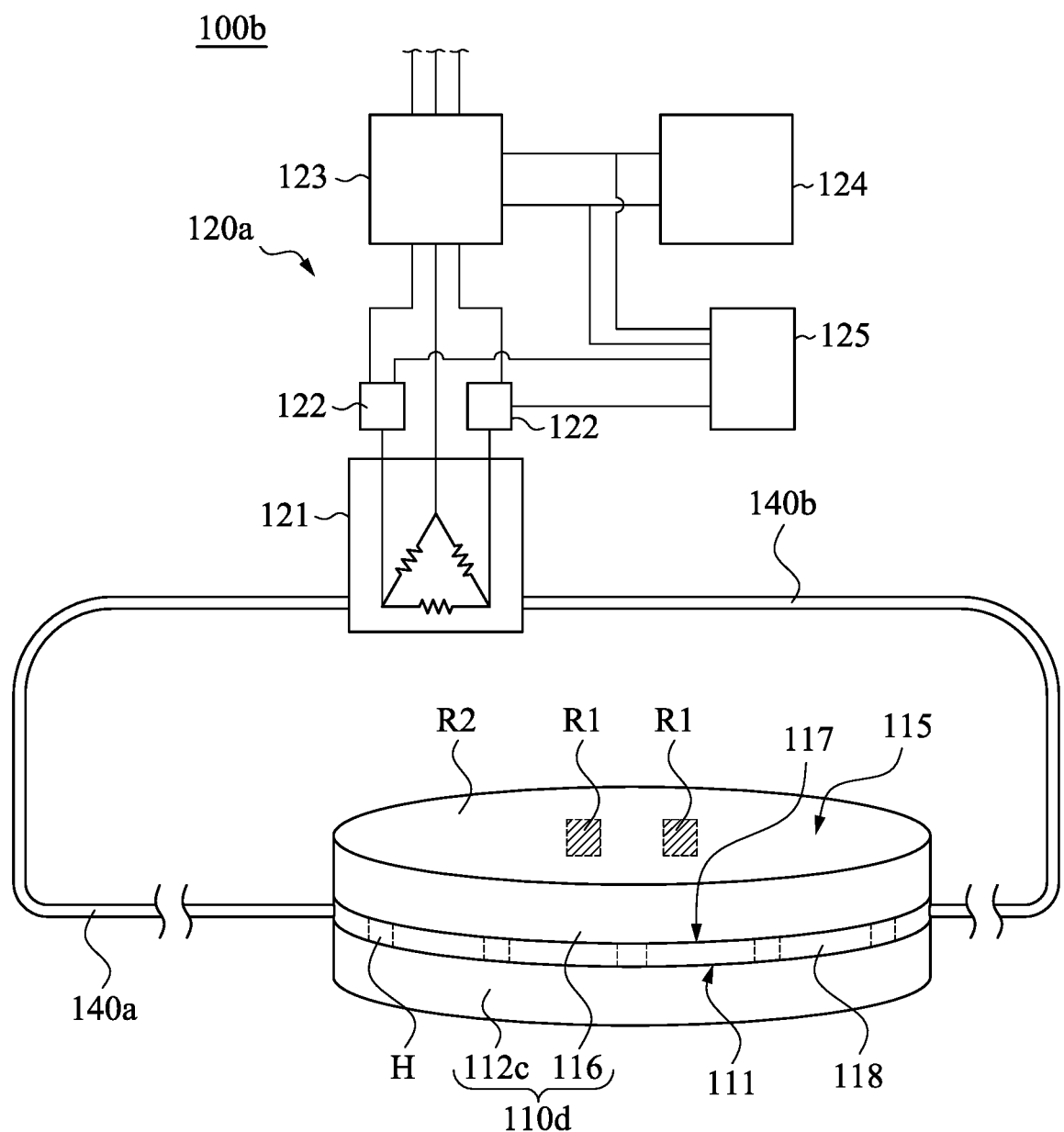
FIG. 11 is a perspective view of a reflection mirror assembly in accordance with some embodiments of the present disclosure.

FIG. 11 is a perspective view of a reflection mirror assembly 100*b* in accordance with some embodiments of the present disclosure. The reflection mirror assembly 100*b* includes a reflection mirror 110*d*, a heater H, and a temperature control system 120*a*. The heater H is in the reflection mirror 110*d*, and is below the reflection surface 115 of the reflection mirror 110*d*. Moreover, the reflection mirror 110*d* includes the first portion 112*c* (i.e., the lower portion) and the second portion 116 (i.e., the upper portion). The upper portion 116 is on the lower portion 112*c* and has the reflection surface 115 that faces away from the lower portion 112*c*. When the reflection mirror 110*d* receives a light of the light source 210 (see FIG. 1), the upper portion 116 has a first region R1 and a second region R2, in which the light of the light source 210 is pointed toward the first region R1 of the upper portion 116. The heater H is aligned with the second region R2 of the upper portion 116. In other words, the second region R2 of the upper portion 116 overlaps the heater H. The heater H is between the lower portion 112*c* and the upper portion 116 of the reflection mirror 110*d*. In some embodiments, the upper portion 116 is adhered to the lower portion 112*c* through the adhesive layer 118. The adhesive layer 118 is between the top surface 111 of the lower portion 112*c* and the bottom surface 117 of the upper portion 116, and further surrounds the heater H. The temperature control system 120*a* is electrically connected to the heater H through wires 140*a* and 140*b*.

In some embodiments, the heater H may be in contact with at least one of the lower portion 112*c* and the upper portion 116 of the reflection mirror 110*d* for good thermal conduction. The temperature control system 120*a* is thermally coupled to the heater H. The temperature control system 120*a* may include, but not limited to an electric furnace 121, a current transformer (CT) 122, a solid state relay (SSR) 123, a temperature controller 124, and a digital heating and alarm device 125. The electric furnace 121 is electrically connected to the heater H through wires 140*a* and 140*b*. The current transformer 122 is electrically connected to the electric furnace 121, the solid state relay 123, and the digital heating and alarm device 125. In addition, the solid state relay 123 may be electrically connected to the electric furnace 121, the temperature controller 124, and the digital heating and alarm device 125. The temperature controller 124 is electrically connected to the digital heating and alarm device 125. Three phase power may be provided to the solid state relay 123.

The formation of the reflection mirror 110*d* includes the reflection mirror 110*d* is cut to form the lower portion 112*c* and the upper portion 116. Thereafter, the heater H is placed on at least one of the lower portion 112*c* and the upper portion 116 of the reflection mirror 110*d*. Afterwards, the upper portion 116 is adhered to the lower portion 112*c* such that the heater H is between the lower portion 112*c* and the upper portion 116 of the reflection mirror 110*d*.

Figure 12:
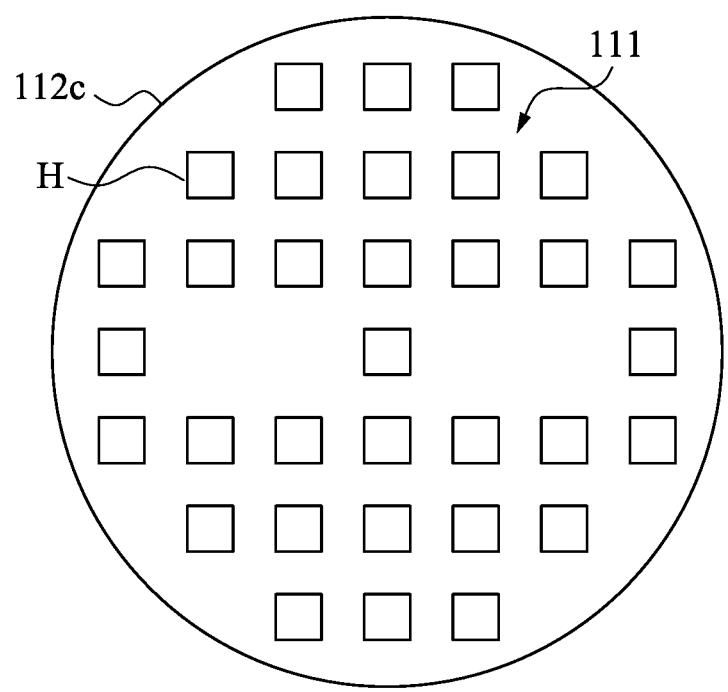
FIG. 12 is a top view of a lower portion of the reflection mirror of FIG. 11 when an upper portion of the reflection mirror is removed.

FIG. 12 is a top view of the lower portion 112*c* of the reflection mirror 110*d* of FIG. 11 when the upper portion 116 of the reflection mirror 110*d* is removed. As shown in FIG. 11 and FIG. 12, in some embodiments, the heater H may be a transistor or a heating coil, but the present disclosure is not limited in this regard. In some embodiments, the heater H is disposed on the top surface 111 of the lower portion 112*c*. In alternative embodiments, the heater H is disposed on the bottom surface 117 of the upper portion 116. The temperature control system 120*a* is configured to control the temperature of the heater H in the reflection mirror 110*d*. The heater H having a high temperature can increase a temperature of a partial region of the reflection mirror 110*d* near the heater H.

When the photolithography imaging system 200 of FIG. 1 is in operation, because the reflection mirror 110*d* of the reflection mirror assembly 100*b* has the heater H therein, the heater H can increase the temperature of the reflection mirror 110*d* even if the reflection mirror 110*d* is in the vacuum environment of the projection optics section 240. Regions of the reflection mirror 110*d* without directly receiving the light of the light source 210 (e.g., the second region R2 of the upper portion 116) may have a lower temperature than regions of the reflection mirror 110*d* directly receiving the light (e.g., the first region R1 of the upper portion 116). The heater H may increase the temperature of the second region R2 of the reflection mirror 110*d*, thereby decreasing temperature difference between the first region R1 and the second region R2. As a result, the temperature of the reflection mirror 110d maintains uniform to prevent from deformation and aberration, thereby increasing production capacity and product yield. In addition, the lifetime of the reflection mirror 110d can be extended and the performance of the EUV radiation can be improved.

In some embodiments, the heater H may be further selectively disposed on the aforementioned lower portions 112, 112a, 112b, 112c, and 112d, and on the aforementioned upper portions 116, 116a, and 116b.

In some embodiments, plural heaters H are between the lower portion 112c and the upper portion 116 of the reflection mirror 110d, and are arranged to straight columns, but the present disclosure is not limited in this regard.

Figure 13:
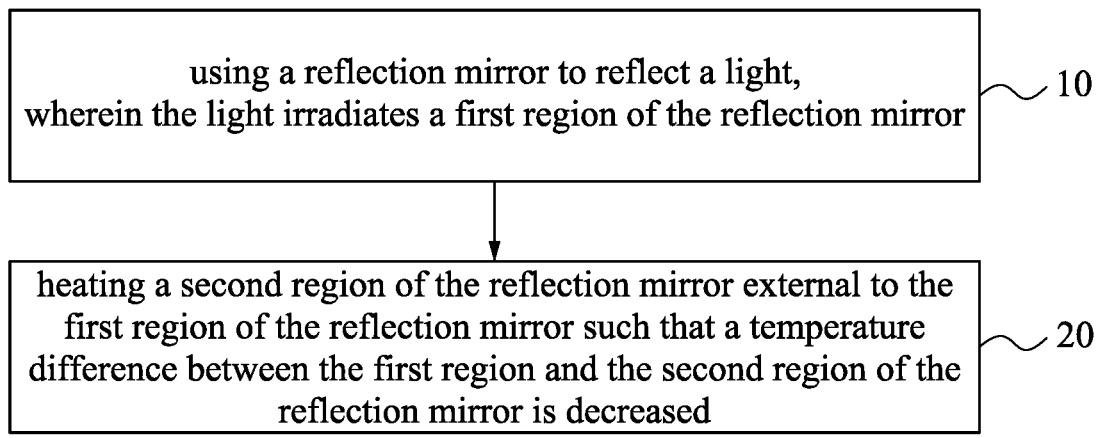
FIG. 13 is a flow chart of a method of operating a semiconductor apparatus in accordance with some embodiments of the present disclosure.

FIG. 13 is a flow chart of a method of operating a semiconductor apparatus in accordance with some embodiments of the present disclosure. The method begins with block 10 in which the reflection mirror 110d is used to reflect a light, wherein the light irradiates the first region R1 of the reflection mirror 110d (as shown in FIG. 11). The method continues with block 20 in which the second region R2 of the reflection mirror 110d external to the first region R1 of the reflection mirror 110d is heated such that a temperature difference between the first region R1 and the second region R2 of the reflection mirror 110d is decreased (as shown in FIGS. 11 and 12). While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

In the following description, other types of reflection mirrors will be described.

Figure 14:
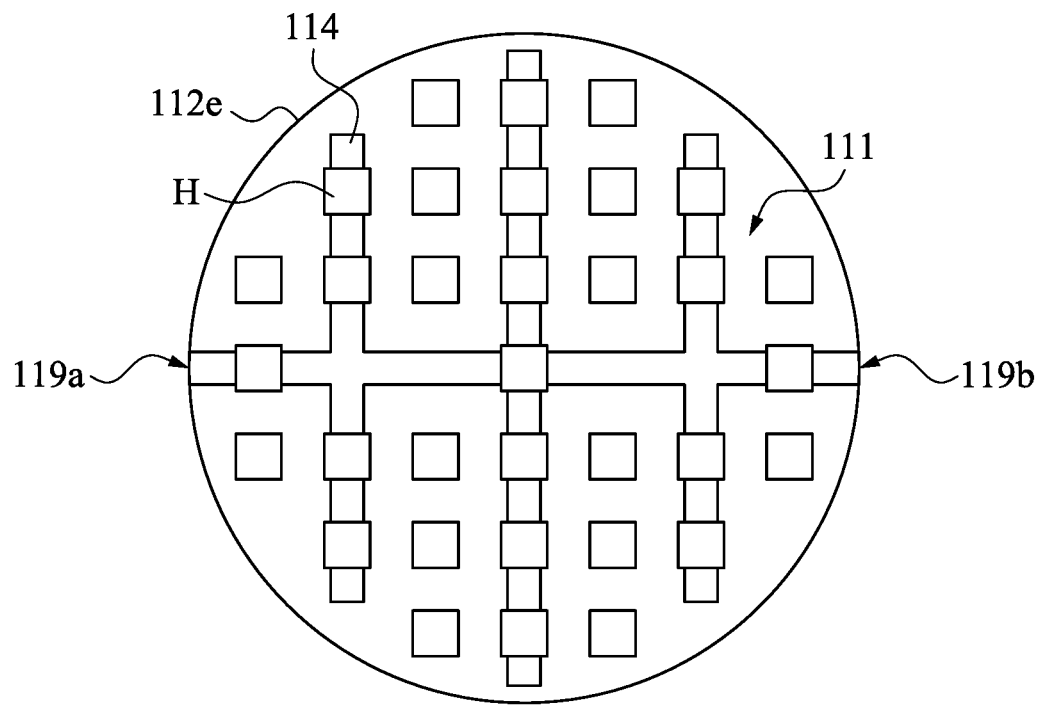
FIG. 14 is a top view of a lower portion of a reflection mirror in accordance with some embodiments of the present disclosure.

FIG. 14 is a top view of a lower portion 112e of a reflection mirror in accordance with some embodiments of the present disclosure. In some embodiments, the lower portion 112e has the channel 114 therein, and also has the heater H thereon. Moreover, the heater H may cover a portion of the channel 114. A fluid flow may be formed to pass through the reflection mirror having the lower portion 112e to dissipate heat of the reflection mirror.

In alternative embodiments, a bottom view of an upper portion of a reflection mirror may be substantially the same as the top view of the lower portion 112e of FIG. 14.

Figure 15:
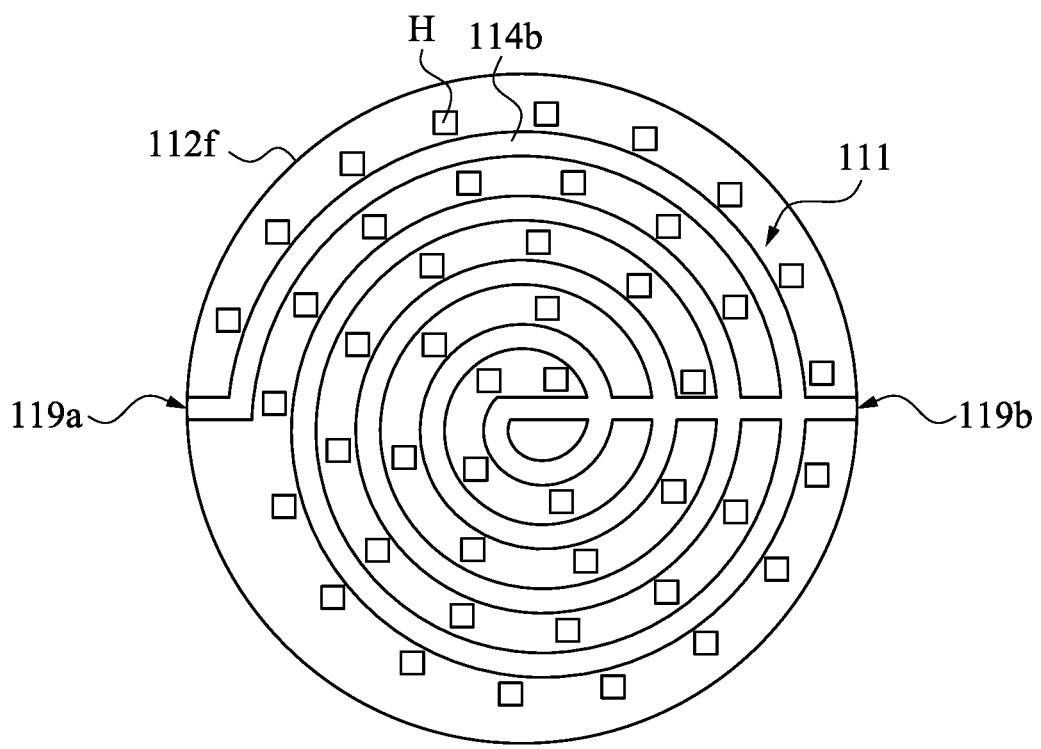
FIG. 15 is a top view of a lower portion of a reflection mirror in accordance with some embodiments of the present disclosure.

FIG. 15 is a top view of a lower portion 112f of a reflection mirror in accordance with some embodiments of the present disclosure. In some embodiments, the lower portion 112f has the channel 114b therein, and also has the heater H thereon. In some embodiments, the lower portion 112f has plural heaters H thereon. The channel 114b has a concentric circular profile, and the heaters H are disposed along a side of the channel 114b and are arranged to a concentric circular, but the present disclosure is not limited in this regard. In alternative embodiments, a bottom view of an upper portion of a reflection mirror may be substantially the same as the top view of the lower portion 112f of FIG. 14.

In the aforementioned embodiments, because the reflection mirror has the channel connected to the heat exchanger, a region of the reflection mirror receiving a light (e.g., EUV radiation) may have a reduced temperature. In addition, because the heater is in the reflection mirror and is aligned with a region of the reflection mirror without directly receiving a light, the temperature of regions of the reflection mirror can be increased. As a result of such configurations, the temperature of the reflection mirror maintains uniform to prevent from deformation and aberration, thereby increasing production capacity and product yield. Moreover, the lifetime of the reflection mirror can be extended and the performance of the EUV radiation can be improved.

According to some embodiments, a semiconductor apparatus includes a light source, a reflection mirror, and a heat exchanger. The reflection mirror has a reflection surface configured to reflect a light of the light source and a channel behind the reflection surface. The heat exchanger is connected to the channel and configured to circulate a working fluid in the channel.

In some embodiments, the reflection mirror has a first portion and a second portion on the first portion, and the channel is defined by a top surface of the first portion and a bottom surface of the second portion.

In some embodiments, the reflection mirror has a first portion and a second portion on the first portion, and the channel has a bottom portion and a top portion that are respectively in a top surface of the first portion and a bottom surface of the second portion.

In some embodiments, the top portion of the channel corresponds to the bottom portion of the channel in position.

In some embodiments, the reflection mirror has a first portion and a second portion on the first portion, and the channel is in a top surface of the first portion.

In some embodiments, the reflection mirror has a first portion and a second portion on the first portion, and the channel is in a bottom surface of the second portion.

In some embodiments, the channel having a straight profile, a curved profile, a cross-shaped profile, a concentric circular profile, or combinations thereof.

In some embodiments, the semiconductor apparatus further includes a heater in the reflection mirror.

In some embodiments, the semiconductor apparatus further includes a plurality of heaters disposed along a side of the channel.

In some embodiments, the semiconductor apparatus further includes a pipe defining the channel and on a bottom surface of the reflection mirror.

In some embodiments, the semiconductor apparatus further includes an adhesive layer in the reflection mirror.

According to some embodiments, a semiconductor apparatus includes a light source, a reflection mirror, and at least one heater. The reflection mirror has a first portion and a second portion on the first portion, and the second portion has a first region and second region, and a light of the light source is pointed toward the first region of the second portion. The at least one heater is between the first portion and the second portion of the reflection mirror, and is aligned with the second region of the second portion.

In some embodiments, the semiconductor apparatus further includes a temperature control system thermally coupled to the at least one heater.

In some embodiments, the at least one heater is in contact with reflection mirror.

In some embodiments, a reflection mirror further has a channel therein, and a plurality of the heaters are disposed along a side of the channel.

In some embodiments, the heaters are arranged to straight columns or a concentric circular.

In some embodiments, the semiconductor apparatus further includes an adhesive layer between the first portion and the second portion of the reflection mirror.

In some embodiments, the adhesive layer surrounds the at least one heater.

According to some embodiments, a method of operating a semiconductor apparatus includes using a reflection mirror to reflect a light, wherein the light irradiates a first region of the reflection mirror, and heating a second region of the reflection mirror external to the first region of the reflection mirror such that a temperature difference between the first region and the second region of the reflection mirror is decreased.

In some embodiments, the method further includes forming a fluid flow passing through the reflection mirror to dissipate heat of the reflection mirror.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not deportion from the spirit and scope of the present disclosure, and that they may make various changes, substitutions, and alterations herein without deportioning from the spirit and scope of the present disclosure.

What is claimed is:

1. An apparatus comprising:
a light source;
a reflection mirror having a reflection surface configured to reflect a light of the light source and a channel behind the reflection surface;
an adhesive layer in the reflection mirror; and
a heat exchanger connected to the channel and configured to circulate a working fluid in the channel.

2. The apparatus of claim 1, wherein the reflection mirror has a first portion and a second portion on the first portion, and the channel is defined by a top surface of the first portion and a bottom surface of the second portion.

3. The apparatus of claim 1, wherein the reflection mirror has a first portion and a second portion on the first portion, and the channel has a bottom portion and a top portion that are respectively in a top surface of the first portion and a bottom surface of the second portion.

4. The apparatus of claim 3, wherein the top portion of the channel corresponds to the bottom portion of the channel in position.

5. The apparatus of claim 1, wherein the reflection mirror has a first portion and a second portion on the first portion, and the channel is defined by a top surface of the first portion.

6. The apparatus of claim 1, wherein the reflection mirror has a first portion and a second portion on the first portion, and the channel is defined by a bottom surface of the second portion.

7. The apparatus of claim 1, wherein the channel has a straight profile, a curved profile, a cross-shaped profile, a concentric circular profile, or combinations thereof.

8. The apparatus of claim 1, further comprising:
a heater in the reflection mirror.

9. The apparatus of claim 1, further comprising:
a plurality of heaters disposed along a side of the channel.

10. The apparatus of claim 1, further comprising:
a pipe defining the channel and on a bottom surface of the reflection mirror.

11. An apparatus comprising:
a light source;
a reflection mirror having a first portion and a second portion on the first portion, wherein the second portion has a first region and second region, wherein a light of the light source is pointed toward the first region of the second portion; and
at least one heater between the first portion and the second portion of the reflection mirror and aligned with the second region of the second portion.

12. The apparatus of claim 11, further comprising:
a temperature control system thermally coupled to the at least one heater.

13. The apparatus of claim 11, wherein the at least one heater is in contact with the reflection mirror.

14. The apparatus of claim 11, wherein the reflection mirror further has a channel therein, and a plurality of heaters that include the at least one heater are disposed along a side of the channel.

15. The apparatus of claim 14, wherein the heaters are arranged in straight columns or a concentric circular.

16. The apparatus of claim 11, further comprising:
an adhesive layer between the first portion and the second portion of the reflection mirror.

17. The apparatus of claim 16, wherein the adhesive layer surrounds the at least one heater.

18. A method comprising:
arranging a reflection mirror to illuminate a first region of the reflection mirror; and
heating, by a heater embedded in the reflection mirror, a second region of the reflection mirror external to the first region of the reflection mirror such that a temperature difference between the first region and the second region of the reflection mirror is decreased.

19. The method of claim 18, further comprising:
forming a fluid flow passing through the reflection mirror to dissipate heat of the reflection mirror.

20. The method of claim 18, wherein arranging the reflection mirror to illuminate the first region of the reflection mirror is such that the first region of the reflection mirror has a higher temperature than the second region of the reflection mirror.

* * * * *